United States Patent
Maruya

(10) Patent No.: US 10,480,071 B2
(45) Date of Patent: Nov. 19, 2019

(54) CONTINUOUS DISTILLATION TRICHLOROSILANE VAPORIZATION SUPPLY APPARATUS

(71) Applicant: Techno Boundary Co., Matsusakashi (JP)

(72) Inventor: Shinji Maruya, Matsusakashi (JP)

(73) Assignee: Techno Boundary Co., Matsusakashi (JP)

( * ) Notice: Subject to any disclaimer, the term of this patent is extended or adjusted under 35 U.S.C. 154(b) by 102 days.

(21) Appl. No.: 14/907,603

(22) PCT Filed: Jul. 22, 2014

(86) PCT No.: PCT/JP2014/069298
§ 371 (c)(1),
(2) Date: Jan. 26, 2016

(87) PCT Pub. No.: WO2015/012257
PCT Pub. Date: Jan. 29, 2015

(65) Prior Publication Data
US 2016/0130727 A1    May 12, 2016

(30) Foreign Application Priority Data
Jul. 26, 2013 (JP) ................. 2013-155657

(51) Int. Cl.
*C23C 16/448* (2006.01)
*C30B 25/14* (2006.01)
(Continued)

(52) U.S. Cl.
CPC ........ *C23C 16/4482* (2013.01); *B01D 5/0057* (2013.01); *C30B 25/14* (2013.01);
(Continued)

(58) Field of Classification Search
CPC ....... B01D 5/0057; C30B 25/14; C30B 29/06; C30B 35/007; G05B 15/02;
(Continued)

(56) References Cited

U.S. PATENT DOCUMENTS 2,217,410 A * 10/1940 Howard ................. F28B 1/06
165/108
4,129,180 A * 12/1978 Larinoff ............... B01D 5/0009
165/111
(Continued)

FOREIGN PATENT DOCUMENTS

CA          2 844 468        2/2013
CA          2844468 A1 *     2/2013 ............ B01D 56/22
(Continued)

OTHER PUBLICATIONS

JPH0847629A_ENG (Espacenet machine translation of Oguru) (Year: 1996).*
(Continued)

*Primary Examiner* — Youngsul Jeong
*Assistant Examiner* — Gabriel E Gitman
(74) *Attorney, Agent, or Firm* — DLA Piper LLP (US)

(57) ABSTRACT

A continuous distillation-type trichlorosilane vaporization supply apparatus includes an evaporator including an introduction port for hydrogen gas as a carrier gas and having a heater that vaporizes liquid trichlorosilane; and a condenser including a cooling device to condense liquid at a temperature corresponding to a saturated vapor pressure, which is lower than a vapor pressure of the vaporized trichlorosilane gas, wherein a center line of the evaporator and a center line of the condenser are not on the same line, and a lower end of the condenser has a structure that communicates with a lower end of the evaporator through a pipe.

4 Claims, 11 Drawing Sheets

(51) Int. Cl.
  *C30B 29/06* (2006.01)
  *C30B 35/00* (2006.01)
  *B01D 5/00* (2006.01)
  *G05B 15/02* (2006.01)
  *F17C 9/02* (2006.01)
  *H01L 21/02* (2006.01)

(52) U.S. Cl.
  CPC ............ C30B 29/06 (2013.01); C30B 35/007 (2013.01); G05B 15/02 (2013.01); F17C 9/02 (2013.01); H01L 21/0262 (2013.01); H01L 21/02532 (2013.01)

(58) Field of Classification Search
  CPC ........... H01L 21/0262; H01L 21/02532; C23C 16/4482; F17C 9/02
  See application file for complete search history.

(56) References Cited

U.S. PATENT DOCUMENTS

| | | | | |
|---|---|---|---|---|
| 4,476,928 A | * | 10/1984 | Green | B01D 1/14 166/266 |
| 5,118,485 A | | 6/1992 | Arvidson et al. | |
| 5,520,858 A | * | 5/1996 | Yamaguchi | B01D 1/0076 261/122.1 |
| 5,550,311 A | * | 8/1996 | Young | A62D 3/20 110/237 |
| 6,039,809 A | | 3/2000 | Toyama et al. | |
| 2012/0070361 A1 | | 3/2012 | Matsuo et al. | |

FOREIGN PATENT DOCUMENTS

| | | | | |
|---|---|---|---|---|
| JP | 1-283817 | | 11/1989 | |
| JP | 08-047629 | | 2/1996 | |
| JP | H0847629 A | * | 2/1996 | ............... B01J 4/00 |
| JP | 11-278987 | | 10/1999 | |
| JP | 2000-319095 | | 11/2000 | |
| JP | 4505077 | | 4/2010 | |
| JP | 4542643 | | 7/2010 | |
| WO | 2011/116448 | | 10/2010 | |

OTHER PUBLICATIONS

Written Opinion dated Oct. 20, 2014 of corresponding PCT/JP2014/069298 along with its English translation.

The First Notice of Examination Opinion dated Dec. 4, 2017, of corresponding Chinese Application No. 201480042111.7, along with an English translation.

English translation of a Second Review Notice dated Oct. 31, 2018, from counterpart Chinese Application No. 201480042111.7.

Notice of Reasons for Rejection dated Jan. 22, 2019, of counterpart Japanese Application No. 2015-528285, along with an English translation.

* cited by examiner

FIG. 8

| | VOLUME OF EVAPORATOR(L) | HEAT TRANSFER AREA OF CONDENSER(m²) | PRESSURE ADJUSTMENT | TEMPERATURE CONTROL | NUMBER OF REACTION CHAMBERS | GAS FLOW RATE(L/min) | TOTAL PRESSURE(MPa) | | CONDENSATION TEMPERATURE(°C) | | LIQUID TEMPERATURE IN EVAPORATOR(°C) | | CONCENTRATION OF MIXED GAS(%) | | THICKNESS OF EPITAXIAL FILM (µm) | |
|---|---|---|---|---|---|---|---|---|---|---|---|---|---|---|---|---|
| EXPERIMENTAL EXAMPLE 1 | 3 | 0.9 | ELECTRONIC CONTROL VALVE | - | 1 | 12 | 0.149 | ±0.0015 △ | 15.0 ◎ | ±0.1 ◎ | 35 | ±0.5 ◎ | 21 | ○ | 4.53 | ±0.04 △ |
| EXPERIMENTAL EXAMPLE 2 | 3 | 0.9 | ELECTRONIC CONTROL VALVE | - | 1 | 12 | 0.150 | ±0.0005 ◎ | 15.0 ◎ | ±0.1 ◎ | 35 | ±0.5 ◎ | 20 | ◎ | 4.51 | ±0.02 ○ |
| EXPERIMENTAL EXAMPLE 3 | 3 | 0.9 | ELECTRONIC CONTROL VALVE | - | 1 | 18 | 0.150 | ±0.0005 ◎ | 15.0 ◎ | ±0.2 ○ | 35 | ±1.5 △ | 21 | ○ | 4.53 | ±0.03 ○ |
| EXPERIMENTAL EXAMPLE 4 | 3 | 0.9 | ELECTRONIC CONTROL VALVE | - | 1 | 12 | 0.150 | ±0.0005 ◎ | 15.0 ◎ | ±0.1 ◎ | 32 | ±0.5 ◎ | 20 | ◎ | 4.51 | ±0.01 ◎ |
| EXPERIMENTAL EXAMPLE 5 | 3 | 1.4 | ELECTRONIC CONTROL VALVE | - | 3 | new method: 12-36 | 0.150 | ±0.0005 ◎ | 15.0 ◎ | ±0.2 ○ | 39.5 | ±2.5 △ | 20-21 △ | | 4.52 | ±0.03 ○ |
| EXPERIMENTAL EXAMPLE 6 | 3 | 1.4 | ELECTRONIC CONTROL VALVE | - | 3 | new method: 18-54 | 0.150 | ±0.0005 ◎ | 15.0 ◎ | ±0.3 × | 39.5 | ±3.5 × | 20-22 △ | | 4.42 | ±0.21 × |
| EXPERIMENTAL EXAMPLE 7 | 3 | 1.4 | ELECTRONIC CONTROL VALVE | PROPORTIONAL LINKAGE CONTROL BETWEEN FLOW RATE AND TEMPERATURE | 4 | new method: 18-54 | 0.150 | ±0.0002 ◎ | 15.0 ◎ | ±0.2 ○ | 28-38 | | 20 ◎ | | 4.51 | ±0.03 ○ |

◎ DESIRED NUMERICAL VALUE/APPROPRIATE RESULTS
○ NO MANUFACTURING PROBLEMS ALTHOUGH SLIGHTLY DEVIATING FROM DESIRED NUMERAL VALUE/SUBSTANTIALLY APPROPRIATE RESULTS
△ NO SIGNIFICANT MANUFACTURING PROBLEMS ALTHOUGH DEVIATING FROM DESIRED NUMERICAL VALUE/IMPROVEMENT IS DESIRED
× DEVIATED FROM DESIRED NUMERICAL VALUE AND MANUFACTURING PROBLEMS HAD OCCURRED/IMPROVEMENT IS NEEDED

CONTINUOUS DISTILLATION TRICHLOROSILANE VAPORIZATION SUPPLY APPARATUS

TECHNICAL FIELD

This disclosure relates to a continuous distillation-type trichlorosilane vaporization supply apparatus for trichlorosilane gas used as a raw material in the semiconductor industry or the like, and a continuous distillation-type trichlorosilane gas vaporization method.

BACKGROUND

Trichlorosilane ($SiHCl_3$, boiling point 31.8° C.), which is a liquid material at room temperature, for example, along with tetrachlorosilane ($SiCl_4$, boiling point 57.6° C.) and germanium tetrachloride ($GeCl_4$, boiling point 84° C.), is useful in a manufacturing process of a silicon epitaxial wafer, an associated integrated device or the like and is typically gasified for practical use.

In the manufacturing process, one type of trichlorosilane consumption facility includes raw gas introduction means, a heat source such as an infrared lamp, a quartz glass reaction container insulated from the outside air, and gas discharge means.

The reaction container includes a carbon susceptor coated with SiC, and a silicon wafer is placed on the susceptor. The silicon wafer and the susceptor are increased in temperature to a predetermined temperature using the external heat source such as the infrared lamp and are then maintained.

Trichlorosilane is gasified beforehand, and passes over the surface of the silicon wafer on the carbon susceptor, which is maintained at a high temperature and rotates, along with hydrogen gas as a carrier gas and a dopant gas to control specific resistance. At this time, a new silicon layer is formed on the silicon wafer due to a thermal decomposition reaction and a hydrogen reduction reaction. This is a so-called "silicon epitaxial wafer," and is widely used for many silicon devices including an IC.

As one of useful vaporization methods of trichlorosilane that is liquid at room temperature, there is a continuous distillation-type trichlorosilane vaporization supply apparatus including: an evaporator for vaporizing liquid trichlorosilane; a condenser disposed immediately above the evaporator and connected to the evaporator via a connection portion provided with a gate valve; and a controller and a pressure reducer that allows a set pressure and an apparatus internal pressure to be equal to each other, in which the pressure reducer performs a pressure adjusting operation in an electrical manner under instruction of the controller, the condenser has a sufficient heat exchange area to condense substantially the total amount of supersaturated trichlorosilane, the evaporator vaporizes a greater amount of trichlorosilane than a necessary amount for a silicon epitaxial growth apparatus in a state in which the gate valve is open, the vaporized trichlorosilane is fed to the condenser through the connection portion, the condenser condenses substantially the total amount of the supersaturated trichlorosilane, and the condensed trichlorosilane is returned to the evaporator through the connection portion by gravity.

However, the above-described continuous distillation-type trichlorosilane vaporization supply apparatus has high energy loss. More specifically, in the condenser section included in the continuous distillation-type trichlorosilane vaporization supply apparatus, the condensed and liquefied trichlorosilane liquid at a low temperature drops on the evaporator positioned immediately therebelow, and thus the temperature of the trichlorosilane liquid in the evaporator is instantly reduced.

When the temperature of the trichlorosilane liquid in the evaporator is significantly reduced, a needed amount of vaporized trichlorosilane may not be reached, and this causes a reduction in the concentration of trichlorosilane-hydrogen mixed gas. Therefore, there is concern of a reduction in the growth rate of a silicon epitaxial layer or a reduction in specific resistance.

To avoid this, the vaporized amount of trichlorosilane has to be ensured by increasing the thermal capacity and minimizing the decrease in temperature by increasing the temperature of the trichlorosilane liquid in the evaporator to a higher temperature than needed or increasing the capacity of the evaporator.

However, although increasing the temperature of the trichlorosilane in the evaporator generally leads to an increase in the vaporized amount and thus prevents insufficiency in the vaporized amount, there is a need to increase the ability of the condenser and a heat transfer area at the same time. This causes an increase in the capacity of the evaporator, an increase in the size of the apparatus, and an increase in cost. Moreover, depending on the size, strict regulations may be applied by law (Fire Service Act for hazardous materials, Industrial Safety and Health Act for pressure containers), and this requires further increase in expenditure for surrounding facilities and the like.

It could therefore be helpful to provide an apparatus that
1) reduces facility costs or running costs, and
2) is not or slightly regulated by law
by reducing the size further than in the above-described apparatus in the related art having the same ability.

SUMMARY

I thus provide a continuous distillation-type trichlorosilane vaporization supply apparatus including an evaporator including an introduction port for hydrogen gas as a carrier gas and having a heater that vaporizes liquid trichlorosilane; and a condenser including a cooling device to condense liquid at a temperature corresponding to a saturated vapor pressure, which is lower than a vapor pressure of the vaporized trichlorosilane gas, wherein a center line of the evaporator and a center line of the condenser are not on the same line, and a lower end of the condenser has a structure that communicates with a lower end of the evaporator through a pipe.

I also provide a continuous distillation-type trichlorosilane gas vaporization supply method, including proportionally linking a number of running devices that emit signals indicating use of a mixed gas of a trichlorosilane-hydrogen mixed gas consuming facility to a temperature of liquid trichlorosilane in an evaporator.

BRIEF DESCRIPTION OF THE DRAWINGS

FIG. 8 shows a table of results of Experimental Examples.

Figure 1:
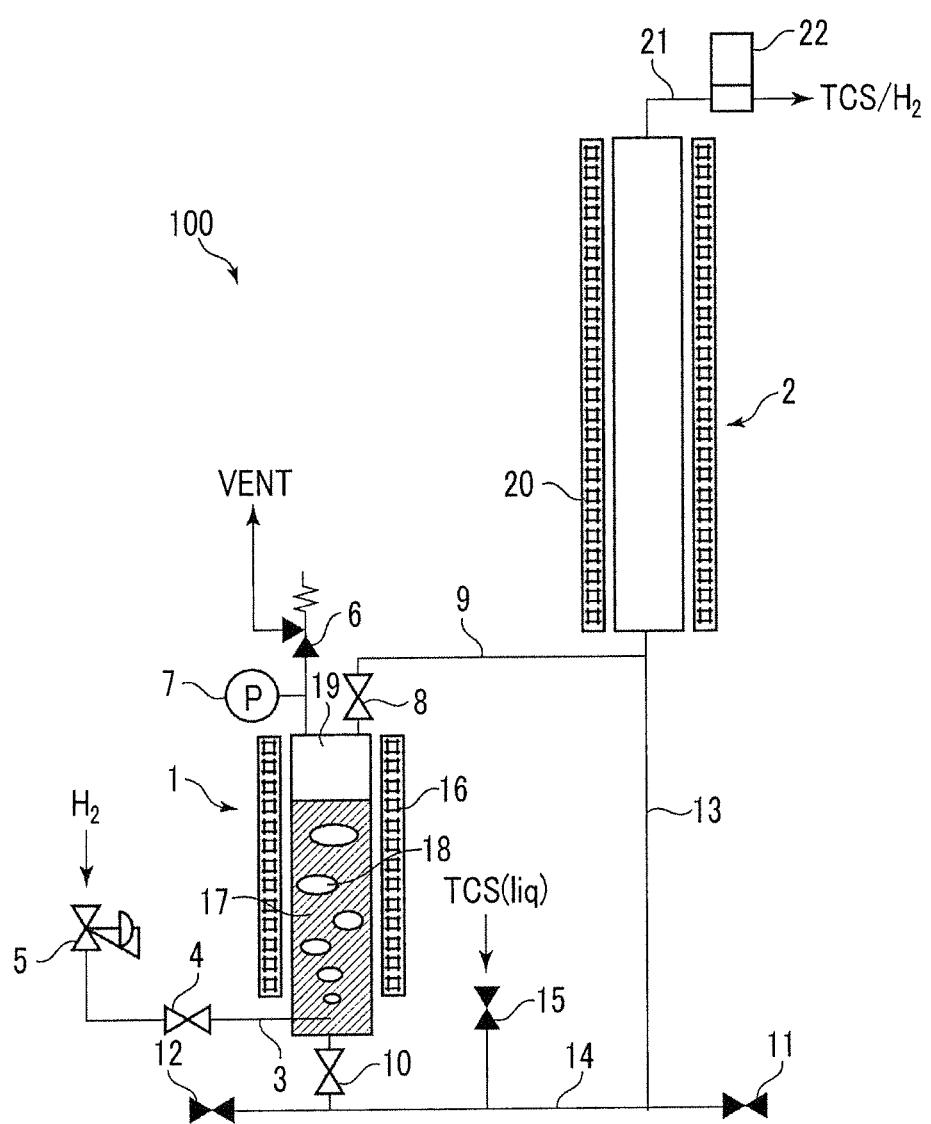
FIG. 1 illustrates a configuration diagram of an example of a trichlorosilane vaporization supply apparatus.

REFERENCE SIGNS LIST 1 evaporator
2 condenser
3 carrier hydrogen gas supply pipe
4 carrier hydrogen gas gate valve
5 pressure adjustor
6 pressure releasing valve (safety valve)
7 pressure gauge and pressure sensor
8 vaporized and mixed gas feeding valve
9 gas communication pipe
10 evaporator lower end valve
11 service valve 1
12 service valve 2
13 trichlorosilane condensed cold liquid collecting pipe
14 trichlorosilane liquid communication pipe
15 trichlorosilane replenishing valve
16 heating means
17 liquid trichlorosilane
18 bubble
19 trichlorosilane-hydrogen mixed gas
20 cooling means
21 adjusted and mixed gas feeding pipe
22 flowmeter and concentration measuring device
23 evaporator jacket spiral passage formation part
24 evaporator jacket
25 evaporator lower portion port
26 evaporator upper portion ferrule
27 bubble spiral rising guide
28 bubble refining part
29 holder
30 condenser ferrule
31 fixed pipe plate
32 tube
33 baffle plate
34 evaporator refrigerant input/output pipe

DETAILED DESCRIPTION

My continuous distillation-type trichlorosilane vaporization supply apparatus includes: an evaporator which includes an introduction port for hydrogen gas as a carrier gas and has heating means to vaporize liquid trichlorosilane; and a condenser including cooling means for condensation at a temperature corresponding to a saturated vapor pressure, which is lower than a vapor pressure of the vaporized trichlorosilane gas, in which a center line of the evaporator and a center line of the condenser are not on the same line, and a lower end of the condenser has a structure that communicates with a lower end of the evaporator through a pipe.

The continuous distillation-type trichlorosilane vaporization supply apparatus may further include: a precision temperature control mechanism of the condenser; and a precision pressure adjusting mechanism of the condenser.

The condenser may include means for supplying the trichlorosilane to a plurality of devices.

An upper end of the condenser may be provided with a distribution portion for distributing the trichlorosilane that has passed through the condenser to the plurality of devices.

The condenser may include a plurality of gas conduction pipes, and the distribution portion may include a divided plate for partitioning outlets of the plurality of gas conduction pipes into the number of the plurality of devices.

An adjusted and mixed gas feeding pipe for feeding the trichlorosilane to the plurality of devices may be connected to each of the outlets of the plurality of gas conduction pipes which are partitioned.

My continuous distillation-type trichlorosilane gas vaporization supply method includes: proportionally linking the number of running devices that emit signals indicating use of a mixed gas of a trichlorosilane-hydrogen mixed gas consuming facility to a temperature of liquid trichlorosilane in an evaporator.

Since the trichlorosilane liquid that is condensed in the condenser and is at a cold temperature does not directly drop on the evaporator and is returned to the lower portion of the evaporator through the pipes, the trichlorosilane liquid level temperature in the evaporator is not extremely decreased.

Therefore, the liquid temperature of the trichlorosilane in the evaporator is easily controlled and, as a result, the capacity of the evaporator can be reduced.

Accordingly, a low ability of the condenser is satisfactory, and this consequently leads to a reduction in energy cost, a reduction in an apparatus installation area, and a reduction in apparatus cost.

Furthermore, depending on the size, regulations on pressure containers applied to the evaporator and regulations on hazardous materials may be slight. This is because regulations become looser as the volume of the pressure container is decreased (in descending order by volume, first type pressure containers -> small pressure containers -> simple containers ->unspecified). In addition, a multiple of a designated quantity regarding the hazardous materials is also reduced, and thus relaxation of regulations in the Fire Service Act is expected (the designated quantity or higher -> ⅕ or higher of the designated quantity ->⅕ or lower of the designated quantity).

In addition, when the evaporator is subjected to overhaul inspection, heavy items such as the condenser are not present immediately thereabove, and thus rapid, safe, and high-quality inspection can be performed.

In addition, by proportionally linking the total flow rate of concentration-adjusted trichlorosilane-hydrogen mixed gas that is fed, to the temperature of liquid trichlorosilane in the evaporator, concentration control can be achieved with higher accuracy in a flow rate range in which the ability of the apparatus is relatively low.

An example of my continuous distillation-type trichlorosilane vaporization supply apparatus will be described in detail with reference to the drawings.

FIG. 1 is a schematic view illustrating an example of the continuous distillation-type trichlorosilane vaporization supply apparatus.

As illustrated in FIG. 1, a continuous distillation-type trichlorosilane vaporization supply apparatus 100 includes an evaporator 1 and a condenser 2.

The evaporator 1 includes an introduction port 3 for hydrogen gas as a carrier gas, and has heating means 16 that vaporizes liquid trichlorosilane.

The condenser 2 includes cooling means 20 for condensation at a temperature corresponding to a saturated vapor pressure, which is lower than the vapor pressure of the vaporized trichlorosilane gas.

In addition, the continuous distillation-type trichlorosilane vaporization supply apparatus 100 is characterized by having a structure in which the center line of the evaporator 1 and the center line of the condenser 2 are not on the same line, and the lower end of the condenser 1 communicates with the lower end of the evaporator 2 through a pipe.

In addition, the continuous distillation-type trichlorosilane vaporization supply apparatus 100 includes a precision temperature control mechanism and a pressure adjusting mechanism and thus can produce a trichlorosilane-hydrogen mixed gas (hereinafter, TCS/H$_2$) subjected to a high-degree concentration control.

As in conventional apparatus, the apparatus 100 is based on the principle that, when a temperature in a gas-liquid two-phase system is constant, the vapor pressure of the liquid is constant, and by allowing the total pressure including hydrogen as a carrier gas to be constant, a mixed gas having a constant concentration can be obtained.

The evaporator 1 may be a container that maintains liquid trichlorosilane 17 as the content to a temperature higher than at least the condensation temperature thereof, and enables bubbling of hydrogen 18 as the carrier gas. The trichlorosilane can be vaporized (19) to have a higher concentration than the concentration of the trichlorosilane-hydrogen mixed gas that is finally adjusted and discharged. Therefore, the evaporator 1 includes heating means 16 and the carrier hydrogen gas supply pipe 3.

The liquid trichlorosilane may pass through a trichlorosilane replenishing valve 15 at a pressure higher than the pressure of the evaporator 1 and may be forcibly fed to replenish the evaporator 1 to achieve an appropriate liquid level range through feedback of liquid level data obtained by a liquid level measuring device (not illustrated). Therefore, it is preferable that an evaporator lower end valve 10 is always open.

In addition, when the trichlorosilane-hydrogen mixed gas is consumed by a trichlorosilane consumption facility such as a silicon epitaxial growth device, the total pressure in the trichlorosilane vaporization supply apparatus is decreased. Therefore, to maintain a constant total pressure, the hydrogen gas passes through a pressure adjustor 5 having high responsiveness, as the precision pressure adjusting mechanism and is blown into the evaporator through the carrier hydrogen gas supply pipe.

In an electronic pressure adjustor, which enables faster control, feedback control may be performed by using a process value of a pressure gauge and pressure sensor 7. It is preferable that a carrier hydrogen gas gate valve 4 is typically open. The evaporator 1 may include a safety valve 6 to correspond to an abnormal increase in internal pressure. The evaporator 1 may include a vaporized and mixed gas feeding valve 8 in the upper section. The value is typically open, and the high-concentration trichlorosilane-hydrogen mixed gas vaporized by the evaporator may pass through a gas communication pipe 9 and enter the condenser 2.

The condenser 2 is cooled to an always constant temperature by the cooling means 20, and the trichlorosilane correspondingly supersaturated is condensed and liquefied. The trichlorosilane-hydrogen mixed gas that becomes a saturated vapor at a cooling temperature may pass through an adjusted and mixed gas feeding pipe 21 and may be fed to the silicon epitaxial growth device. A flowmeter and concentration measuring device 22 disposed in the adjusted and mixed gas feeding pipe 21 is used to check operation status.

On the other hand, the trichlorosilane condensed in the condenser 2 may pass through a trichlorosilane condensed cold liquid collecting pipe 13, a trichlorosilane liquid communication pipe 14, and the evaporator lower end valve 10 and may be returned to the bottom section of the evaporator 1.

Next, the evaporator 1 and the condenser 2, which are main components, will be further described.

Figure 2:
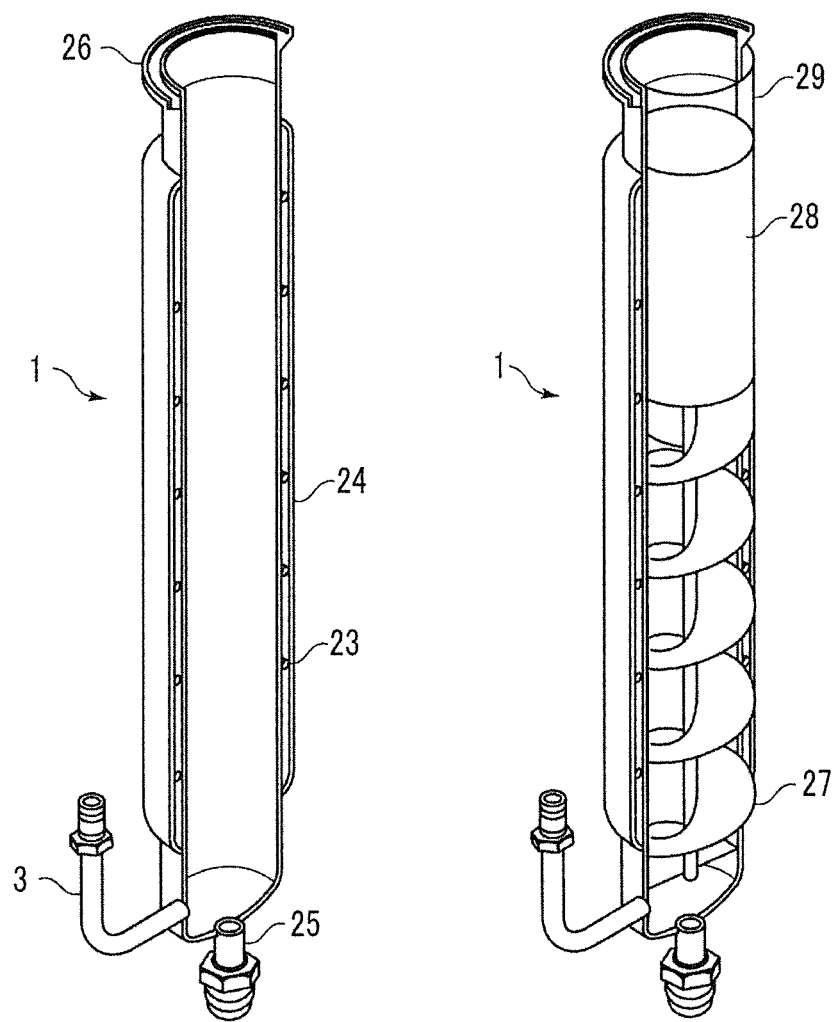
FIG. 2 illustrates an example of an evaporator used in the apparatus.

A method of heating the evaporator 1 may be a heater or a heating medium. FIG. 2 illustrates a jacket type in a heating medium heating type as an example of the evaporator 1. The heating medium may be circulated in a spiral shape along an evaporator inner tube by an evaporator jacket spiral passage formation part 23 provided between an evaporator jacket 24 and the evaporator inner tube.

The upper portion of the evaporator 1 communicates with the condenser 2 through the vaporized and mixed gas feeding valve 8 and the gas communication pipe 9 from an evaporator upper portion ferrule 26. The lower portion of the evaporator 1 communicates with the trichlorosilane liquid communication pipe 14 through an evaporator lower portion port 25 and the evaporator lower end valve 10. As the heating medium, an inert material, for example, a fluorine-based material such as FLUORINERT (registered trademark) or GARDEN (registered trademark) is appropriate.

The evaporator 1 in FIG. 2 is characterized by a cylindrical shape. This is because a time to alloy bubbles 18 to stay is increased by longitudinally elongating the evaporator 1 and thus a larger amount of trichlorosilane steam is incorporated into the bubbles.

FIG. 2 illustrates another example. A bubble spiral rising guide 27, a bubble refining part 28, and a holder 29 are inserted into the evaporator 1. This is for the purpose of decreasing a bubble rising speed, increasing a rising process distance, increasing a bubble surface area, or the like.

Figure 3:
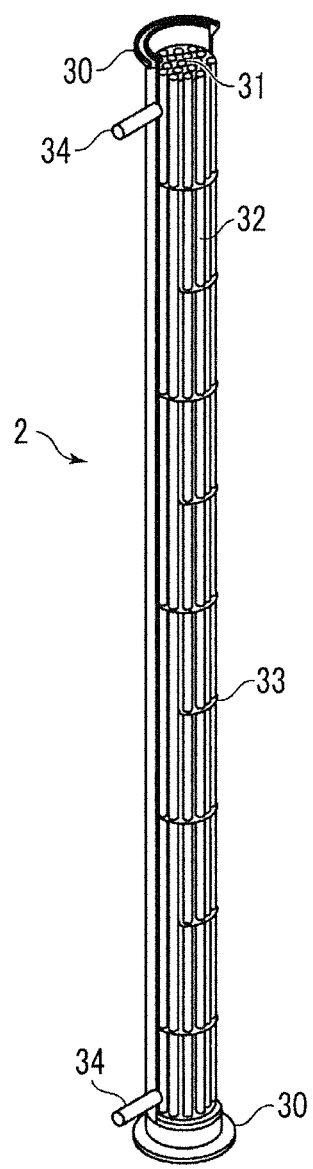
FIG. 3 illustrates an example of a condenser used in the apparatus.

FIG. 3 illustrates the structure of a multi-pipe heat exchanger of an example of the condenser 2. The high-concentration trichlorosilane-hydrogen mixed gas fed from the evaporator 1 intrudes into and passes through the inside of a plurality of tubes 32 from the lower portion. Reference numeral 30 denotes a condenser ferrule, reference numeral 31 denotes a fixed pipe plate, and reference numeral 33 denotes a baffle plate. A refrigerant is circulated through the shell portion of the condenser 2 by an evaporator refrigerant input/output pipe 34.

Figure 4:
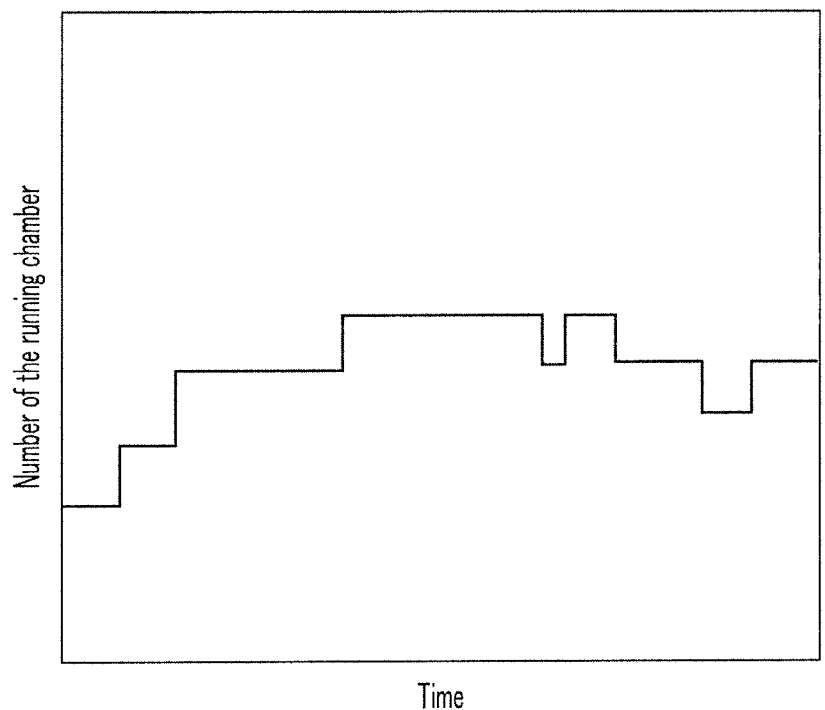
FIG. 4 illustrates examples (10 cases) of the number of actually running devices when silicon epitaxial growth devices are allowed to arbitrarily run.

Another aspect of my apparatus is achieved by proportionally linking the total flow rate of concentration-adjusted trichlorosilane-hydrogen mixed gas that is fed, to the temperature of liquid trichlorosilane in the evaporator. When a plurality of silicon epitaxial growth devices connect to the trichlorosilane vaporization supply apparatus and the silicon epitaxial growth devices are allowed to run at individual timings with individual growth recipes, the number of running silicon epitaxial growth devices, for example, ten silicon epitaxial growth devices undergo a random change with time as shown in FIG. 4.

Naturally, in proportion to the number of running devices and, more accurately, the number of devices that actually use trichlorosilane-hydrogen mixed gas, the amount of consumed trichlorosilane-hydrogen mixed gas or the amount of trichlorosilane-hydrogen mixed gas fed from the trichlorosilane vaporization supply apparatus is increased or decreased.

Vaporizing trichlorosilane using the evaporator according to the total flow rate of the maximum amount of fed trichlorosilane-hydrogen mixed gas, which is considered to maintain the concentration of the mixed gas that is fed means always maintaining the temperature of trichlorosilane at a high temperature, which results in energy loss in terms of efficiency.

Figure 5:
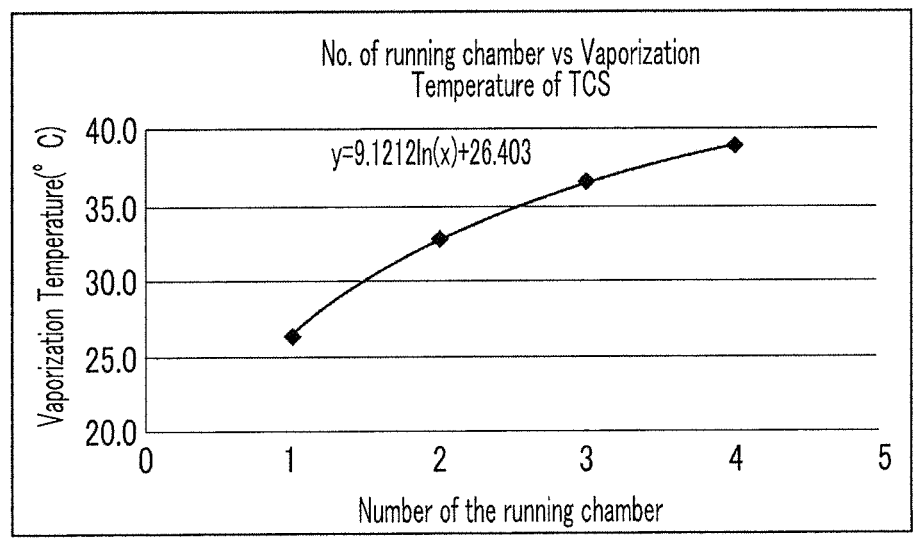
FIG. 5 illustrates an example of temperature setting by the evaporator.
Figure 6:
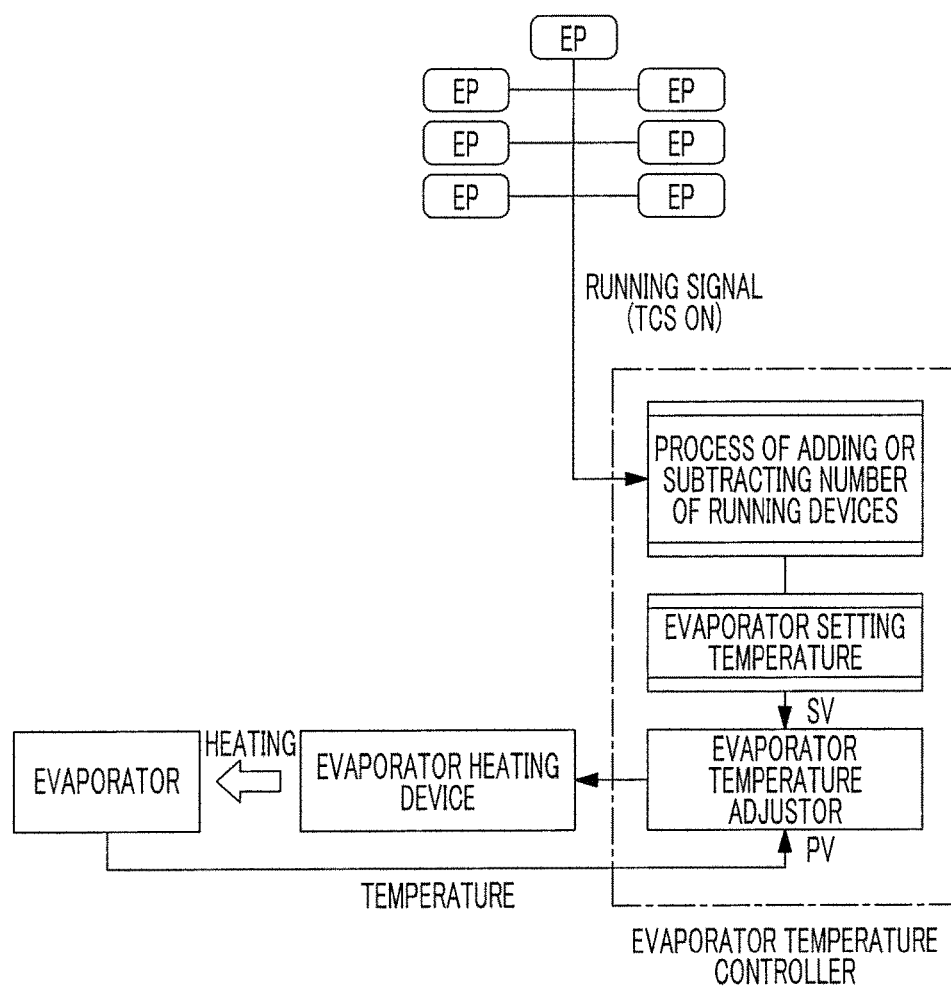
FIG. 6 illustrates a temperature control block diagram.

The precision temperature adjusting mechanism can receive signals from the silicon epitaxial growth devices using the trichlorosilane-hydrogen mixed gas and control the temperature of trichlorosilane in the evaporator to a temperature corresponding to the number of devices to not allow the amount of trichlorosilane vaporized from the evaporator to be excessive. Strictly speaking, various cases depending on the types of silicon epitaxial devices, epitaxial growth conditions, and the like are postulated. However, I confirmed by an experiment that the relationship shown in FIG. 5 is appropriate for an evaporator having a capacity of 3 liters in the shape illustrated in FIG. 2. FIG. 6 illustrates a temperature control block diagram.

The silicon epitaxial growth devices can emit ON signals simultaneously with the use of trichlorosilane-hydrogen mixed gas. An evaporator temperature controller of the trichlorosilane vaporization supply apparatus adds or subtracts the signals to be used as the number of running devices. A setting temperature of the evaporator according to the number of running devices is operated by the mathematical expression in FIG. 5, and the operation results are used as the temperature setting value of the temperature adjuster of the evaporator. Accordingly, so-called "proportional linkage control" between the flow rate of the fed gas and the temperature of liquid trichlorosilane becomes possible.

Figure 7:
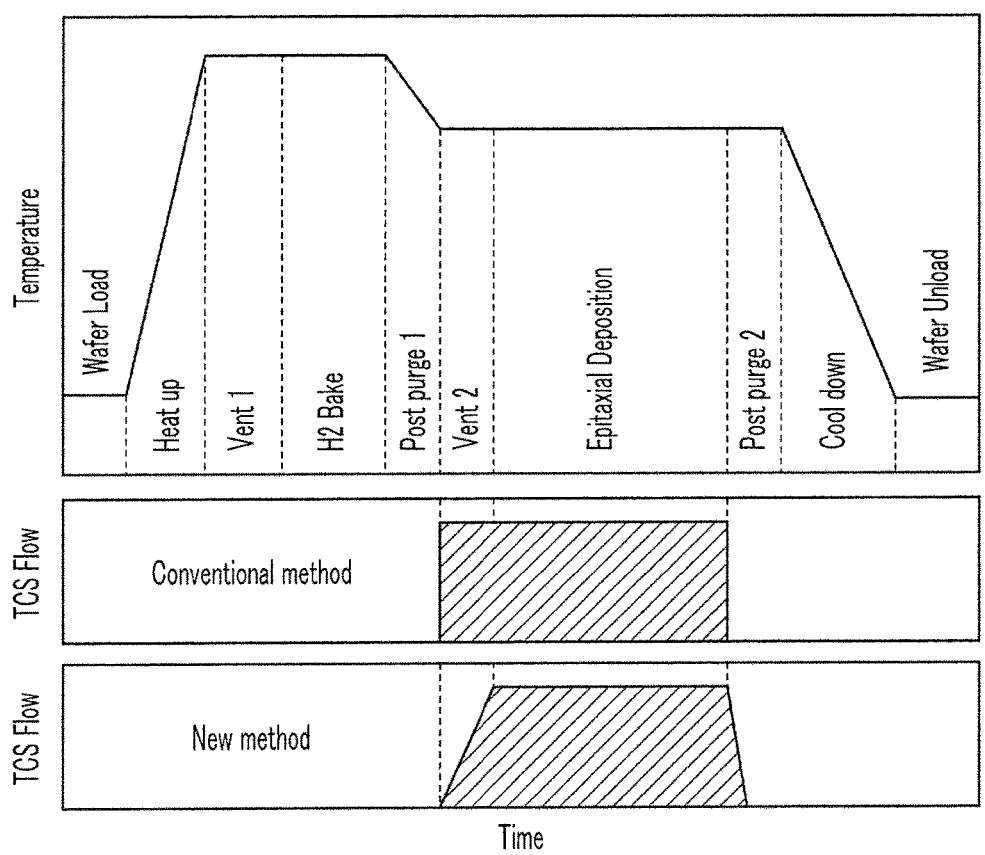
FIG. 7 illustrates an epitaxial growth recipe.

An example of the silicon epitaxial growth device is shown in FIG. 7. Epitaxial growth is achieved by allowing a predetermined amount of the trichlorosilane-hydrogen mixed gas to pass through the reaction container of the corresponding device. Typically (Conventional Method), the same amount of the mixed gas is not allowed to pass through the reaction container and is discharged to the outside of the system before epitaxial growth (Vent 2), and the mixed gas is introduced to the reaction container by an operation of an included valve simultaneously with the start of the epitaxial growth. After epitaxial growth, the same amount of the corresponding gas introduced to the reaction container by the operation of the included valve is discharged to the outside of the system again (Post Purge 2).

In the above-mentioned steps, the flow rate of the trichlorosilane-hydrogen mixed gas rapidly changes at the time of the start and at the end, and this causes a pressure change in the supply system of the mating terminal, that is, the trichlorosilane vaporization supply apparatus. When a single trichlorosilane vaporization supply apparatus replenishes a single silicon epitaxial growth device, there is no problem with the operation of the valve. Moreover, even when a single trichlorosilane vaporization supply apparatus replenishes an extremely large number of silicon epitaxial growth devices, the ratio of the flow rate of the mixed gas occupied by a single device with respect to the total flow rate of the trichlorosilane-hydrogen mixed gas is low, and thus there is no problem.

On the other hand, when two or a number of silicon epitaxial growth devices connect to a single trichlorosilane vaporization supply apparatus and the silicon epitaxial growth devices are allowed to run at individual timings with individual growth recipes, the rate of change in the flow rate of the mixed gas caused by the single silicon epitaxial growth device is not negligible. As a result, a pressure change in the system occurs and, moreover, the concentration of the trichlorosilane-hydrogen mixed gas significantly changes.

To solve those problems, by using a pressure adjustor having very high responsiveness, another method in which the rate of change in the flow rate at Vent 2 and Post Purge 2 in the connected silicon epitaxial growth device is reduced may be enforced.

EXPERIMENTAL EXAMPLE 1

As the main equipment of the apparatus, an evaporator having a capacity of about 3 liters and a condenser having a heat transfer area of about 0.9 $m^2$ were used. A pressure reducing valve of a mechanical type was used as the pressure adjustor, and a single silicon epitaxial growth device was connected for a test. As the silicon epitaxial growth device for the test, a single sheet-type device that processes sheets one by one was used. As an epitaxial substrate, a P+ substrate coated with an oxide film at the rear surface was used. A generally desired epitaxial film was subjected to a growth rate of 3 μm/min, a thickness of 4.5 μm, and a growth time of 90 seconds, and the flow rate of the trichlorosilane-hydrogen mixed gas fed from the apparatus to the silicon epitaxial growth device was 12 L/min during the test. On the other hand, as for the conditions of the apparatus, the total pressure was 0.149±0.0015 MPa (gauge pressure), the condensation temperature was 15.0±0.1° C., and the concentration of the trichlorosilane-hydrogen mixed gas produced at a trichlorosilane liquid temperature of 35±0.5° C. in the evaporator was about 21%. The test was conducted by evaluating the amount of change between batches when 25 sheets were continuously grown. As a result, the thickness of the epitaxial film at the center of 25 wafers was 4.53±0.04 μm. I believe that, due to the characteristics of the pressure adjustor in the mechanical type, an extremely small pressure drop had occurred during the growth and, accordingly, the concentration of the mixed gas was slightly increased.

EXPERIMENTAL EXAMPLE 2

The effect of using a precision pressure adjustor was examined. As the main equipment of the apparatus, an evaporator having a capacity of about 3 liters and a condenser having a heat transfer area of about 0.9 $m^2$ were used. An electronic pressure control valve having very high responsiveness was used as the pressure adjustor, and a single silicon epitaxial growth device was connected for a test. As the silicon epitaxial growth device for the test, a single sheet-type device that processes sheets one by one was used. As an epitaxial substrate, a P+ substrate coated with an oxide film at the rear surface was used. A generally desired epitaxial film was subjected to a growth rate of 3 μm/min, a thickness of 4.5 μm, and a growth time of 90 seconds, and the flow rate of the trichlorosilane-hydrogen mixed gas fed from the apparatus to the silicon epitaxial growth device was 12 L/min during the test. On the other hand, as for the conditions of the apparatus, the total pressure was 0.150±0.0005 MPa (gauge pressure), the condensation temperature was 15.0±0.1° C., and the concentration of the trichlorosilane-hydrogen mixed gas produced at a trichlorosilane liquid temperature of 35±0.5° C. in the evaporator was about 20%. The test was conducted by evaluating the amount of change between batches when 25 sheets were continuously grown. As a result, the thickness of the epitaxial film at the center of 25 wafers was 4.51±0.02

μm. Since the electronic pressure control valve was used as the pressure adjustor, the pressure during the entire period of the test became substantially constant. Accordingly, there was no significant change in the thickness of the epitaxial film.

EXPERIMENTAL EXAMPLE 3

The effect of increasing the flow rate of the trichlorosilane-hydrogen mixed gas was examined. As the main equipment of the apparatus, an evaporator having a capacity of about 3 liters and a condenser having a heat transfer area of about 0.9 m$^2$ were used, an electronic pressure control valve having very high responsiveness was used as the pressure adjustor, and a single silicon epitaxial growth device was connected for a test. As the silicon epitaxial growth device for the test, a single sheet-type device which processes sheets one by one was used. As an epitaxial substrate, a P+ substrate coated with an oxide film at the rear surface was used. A generally desired epitaxial film was subjected to a growth rate of 3.45 μm/min, a thickness of 4.5 μm, and a growth time of 78 seconds, and the flow rate of the trichlorosilane-hydrogen mixed gas fed from the apparatus to the silicon epitaxial growth device was 18 L/min during the test. On the other hand, as for the conditions of the apparatus, the total pressure was 0.150±0.0005 MPa (gauge pressure), the condensation temperature was 15.1±0.2° C., and the concentration of the trichlorosilane-hydrogen mixed gas produced at a trichlorosilane liquid temperature of 35±1.5° C. in the evaporator was about 21%. The test was conducted by evaluating the amount of change between batches when 25 sheets were continuously grown. As a result, the thickness of the epitaxial film at the center of 25 wafers was 4.53±0.03 μm. This was a test in which the flow rate of the fed gas was increased compared to Example 2. I believe that the heat transfer area flow rate ratio of the condenser was decreased as the flow rate of the fed gas was increased, and as a result, slightly insufficient cooling was performed in the condenser, resulting in a slightly increase in the concentration of the mixed gas.

EXPERIMENTAL EXAMPLE 4

The effect of reducing the amount of vaporized trichlorosilane and correspondingly reducing the condensed amount was examined. As the main equipment of the apparatus, an evaporator having a capacity of about 3 liters and a condenser having a heat transfer area of about 0.9 m$^2$ were used, an electronic pressure control valve having very high responsiveness was used as the pressure adjustor, and a single silicon epitaxial growth device was connected to be provided for a test. As the silicon epitaxial growth device for the test, a single sheet-type device that processes sheets one by one was used. As an epitaxial substrate, a P+ substrate coated with an oxide film at the rear surface was used. A generally desired epitaxial film was subjected to a growth rate of 3 μm/min, a thickness of 4.5 μm, and a growth time of 90 seconds, and the flow rate of the trichlorosilane-hydrogen mixed gas fed from the apparatus to the silicon epitaxial growth device was 12 L/min during the test. On the other hand, as for the conditions of the apparatus, the total pressure was 0.150±0.0005 MPa (gauge pressure), the condensation temperature was 15.0±0.1° C., and the concentration of the trichlorosilane-hydrogen mixed gas produced at a trichlorosilane liquid temperature of 32±0.5° C. in the evaporator was about 20%. The test was conducted by evaluating the amount of change between batches when 25 sheets were continuously grown. As a result, the thickness of the epitaxial film at the center of 25 wafers was 4.51±0.01 μm. The vaporized amount in the evaporator was limited and thus the amount to be condensed in the condenser was reduced, that is, the heat transfer area flow rate ratio of the condenser was increased. As a result, this example obtained the best results among all the tests conducted.

EXPERIMENTAL EXAMPLE 5

Increasing the vaporized amount by increasing the vaporization temperature while maintaining the evaporator as it was was examined. As the main equipment of the apparatus, an evaporator having a capacity of about 3 liters and a condenser having a heat transfer area of about 1.4 m$^2$ were used, an electronic pressure control valve having very high responsiveness was used as the pressure adjustor, three silicon epitaxial growth devices were connected, and one of the devices was provided for a test. The epitaxial growth devices were allowed to run at arbitrary timings. As the silicon epitaxial growth device for the test, a single sheet-type device that processes sheets one by one was used. The trichlorosilane-hydrogen mixed gas was introduced into the epitaxial growth device under the conditions of new method of FIG. 7 in which the epitaxial growth recipe is illustrated. That is, when the three epitaxial growth devices used the trichlorosilane-hydrogen mixed gas, the gas was gradually increased from 0 L/min to 12 L/min in the "VENT 2" process to not allow the other devices to be affected by an abrupt pressure effect or the like. As an epitaxial substrate, a P+ substrate coated with an oxide film at the rear surface was used. A generally desired epitaxial film was subjected to a growth rate of 3 μm/min, a thickness of 4.5 μm, and a growth time of 90 seconds. On the other hand, as for the conditions of the apparatus, the total pressure was 0.150±0.0005 MPa (gauge pressure), the condensation temperature was 15.0±0.2° C., and the concentration of the trichlorosilane-hydrogen mixed gas produced at a trichlorosilane liquid temperature of 39.5±2.5° C. in the evaporator was about 20% to 21%. The flow rate of the trichlorosilane-hydrogen mixed gas fed from the apparatus to the silicon epitaxial growth device was changed to 12 L/min to 36 L/min during the test. The test was conducted by evaluating the amount of change between batches when 25 sheets were continuously grown. As a result, the thickness of the epitaxial film at the center of 25 wafers was 4.52±0.03 μm. When the set temperature of the evaporator was increased, a necessary vaporized amount could be ensured.

EXPERIMENTAL EXAMPLE 6

As the main equipment of the apparatus, an evaporator having a capacity of about 3 liters and a condenser having a heat transfer area of about 1.4 m$^2$ were used, an electronic pressure control valve having very high responsiveness was used as the pressure adjustor, three silicon epitaxial growth devices were connected, and one of the devices was provided for a test. The epitaxial growth devices were allowed to run at arbitrary timings. As the silicon epitaxial growth device for the test, a single sheet-type device that processes sheets one by one was used. The trichlorosilane-hydrogen mixed gas was introduced into the epitaxial growth device under the conditions of new method of FIG. 7 in which the epitaxial growth recipe is illustrated. That is, when the three epitaxial growth devices used the trichlorosilane-hydrogen mixed gas, the gas was gradually increased from 0 L/min to 18 L/min in the "VENT 2" process to not allow the other devices to be affected by an abrupt pressure effect or the like. As an epitaxial substrate, a P+ substrate coated with an oxide film at the rear surface was used. A generally desired epitaxial film was subjected to a growth rate of 3.45 μm/min, a thickness of 4.5 μm, and a growth time of 78 seconds. On the other hand, as for the conditions of the apparatus, the total pressure was 0.150±0.0005 MPa (gauge pressure), the condensation temperature was 15.0±0.3° C., and the concentration of the trichlorosilane-hydrogen mixed gas produced at a trichlorosilane liquid temperature of 39.5±3.5° C. in the evaporator was about 20% to 22%. The flow rate of the trichlorosilane-hydrogen mixed gas fed from the apparatus to the silicon epitaxial growth device was changed to 18 L/min to 54 L/min during the test. The test was conducted by evaluating the amount of change between batches when 25 sheets were continuously grown. As a result, the thickness of the epitaxial film at the center of 25 wafers was 4.42±0.21 μm. Compared to Example 5, there was an attempt to further increase the flow rate of the mixed gas. However, there were situations in which there was a significant temperature change in trichlorosilane in the evaporator at the timing at which the epitaxial growth device was started to continuously run and at the timing at which the running was finished, resulting in the inability to obtain a necessary vaporized amount, or in contrast, the vaporized amount became excessive and exceeded the ability of the condenser. As a result, the concentration of the trichlorosilane-hydrogen mixed gas was significantly changed.

EXPERIMENTAL EXAMPLE 7

As the main equipment of the apparatus, an evaporator having a capacity of about 3 liters and a condenser having a heat transfer area of about 1.4 $m^2$ were used, an electronic pressure control valve having very high responsiveness was used as the pressure adjustor, a proportional linkage control between the flow rate of the fed gas and the temperature of liquid trichlorosilane was applied to control the temperature of liquid trichlorosilane in the evaporator, four silicon epitaxial growth devices were then connected, and one of the devices was provided for a test. The epitaxial growth devices were allowed to run at arbitrary timings. As the silicon epitaxial growth device for the test, a single sheet-type device that processes sheets one by one was used. The trichlorosilane-hydrogen mixed gas was introduced into the epitaxial growth device under the conditions of new method of FIG. 7 in which the epitaxial growth recipe is illustrated. That is, when the four epitaxial growth devices used the trichlorosilane-hydrogen mixed gas, the gas was gradually increased from 0 L/min to 18 L/min in the "VENT 2" process to not allow the other devices to be affected by an abrupt pressure effect or the like. As an epitaxial substrate, a P+ substrate coated with an oxide film at the rear surface was used. A generally desired epitaxial film was subjected to a growth rate of 3.45 μm/min, a thickness of 4.5 μm, and a growth time of 78 seconds. On the other hand, as for the conditions of the apparatus, the total pressure was 0.150±0.0005 MPa (gauge pressure), the condensation temperature was 15.0±0.2° C., and the trichlorosilane liquid temperature in the evaporator was changed to 28° C. to 38° C. in correspondence with the number of epitaxial growth devices subjected to epitaxial growth, and the concentration of the produced trichlorosilane-hydrogen mixed gas was about 20%. The flow rate of the trichlorosilane-hydrogen mixed gas fed from the apparatus to the silicon epitaxial growth device was changed to 18 L/min to 54 L/min during the test. The test was conducted by evaluating the amount of change between batches when 25 sheets were continuously grown. As a result, the thickness of the epitaxial film at the center of 25 wafers was 4.51±0.03 μm. The apparatus receives signals indicating that the trichlorosilane-hydrogen mixed gas was used from the connected epitaxial growth devices, sets the trichlorosilane liquid temperature in the evaporator according to the number of devices, and prevents overshooting in the trichlorosilane liquid temperature in the evaporator shown in Example 6 due to a smooth change in the amount of the mixed gas used in the "VENT 2" process. As a result, the concentration of the trichlorosilane-hydrogen mixed gas could be maintained in a substantially constant level. The operation power for heating the evaporator could be reduced by 14%.

FIG. 8 is a table showing the conditions and results of Experimental Examples 1 to 7.

As shown in FIG. 8, regarding Experimental Examples 1 to 4 in which the gas was supplied to the single reaction chamber, in Experimental Example 2, compared to Experimental Example 1, the electronic pressure adjusting valve was used. Therefore, response during pressure control could be enhanced. Accordingly, accuracy in controlling the total pressure was enhanced. As a result, error in the epitaxial film thickness between batches was reduced.

In Experimental Example 3, the flow rate of the gas was 1.5 times that of Experimental Example 2. Although the accuracy in controlling the total pressure was not changed, accuracy in controlling the temperature of the evaporator was reduced, and thus the burden on the condenser was slightly increased. As a result, the concentration of the mixed gas was slightly thickened, and error in the epitaxial film thickness between batches was slightly worsened.

In Experimental Example 4, compared to Experimental Example 2, the vaporized amount was reduced by decreasing the temperature of the evaporator and thus a burden on the condenser was reduced. As a result, the concentration of the mixed gas was slightly reduced, and error in the epitaxial film thickness between batches was reduced.

In addition, regarding Experimental Examples 5 to 7 in which the gas was supplied to the plurality of reaction chambers, in Experimental Example 5, compared to Experimental Example 2 to 4, there was an attempt to cope with the plurality of epitaxial devices by increasing the vaporization temperature and increasing the vaporized amount. Although the accuracy in controlling the total pressure was not changed, the accuracy in controlling the temperature of the evaporator was reduced, and thus a burden on the condenser was slightly increased. As a result, the concentration of the mixed gas was changed, and error in the epitaxial film thickness between batches was slightly worsened.

In Experimental Example 6, compared to Experimental Example 5, there was an attempt to further increase the flow rate of the mixed gas. However, although the accuracy in controlling the total pressure was not changed, the accuracy in controlling the temperature of the evaporator was further reduced, and thus a burden on the condenser was further increased. There were situations in which a necessary vaporized amount could not be obtained or, in contrast, the vaporized amount became excessive and exceeded the ability of the condenser. As a result, the concentration of the trichlorosilane-hydrogen mixed gas was significantly changed. Consequently, error in the epitaxial film thickness between batches was significantly worsened.

In Experimental Example 7, compared to Experimental Example 6, although the accuracy in controlling the total pressure was not changed, the temperature of the evaporator was increased or decreased with the number of running epitaxial devices. Accordingly, the vaporized amount became an appropriate amount proportionate to the flow rate of the gas. Therefore, a burden on the condenser could be reduced. As a result, the concentration of the gas became stable, and thus error in the epitaxial film thickness between batches was significantly improved and was in an allowable range.

Figure 9:
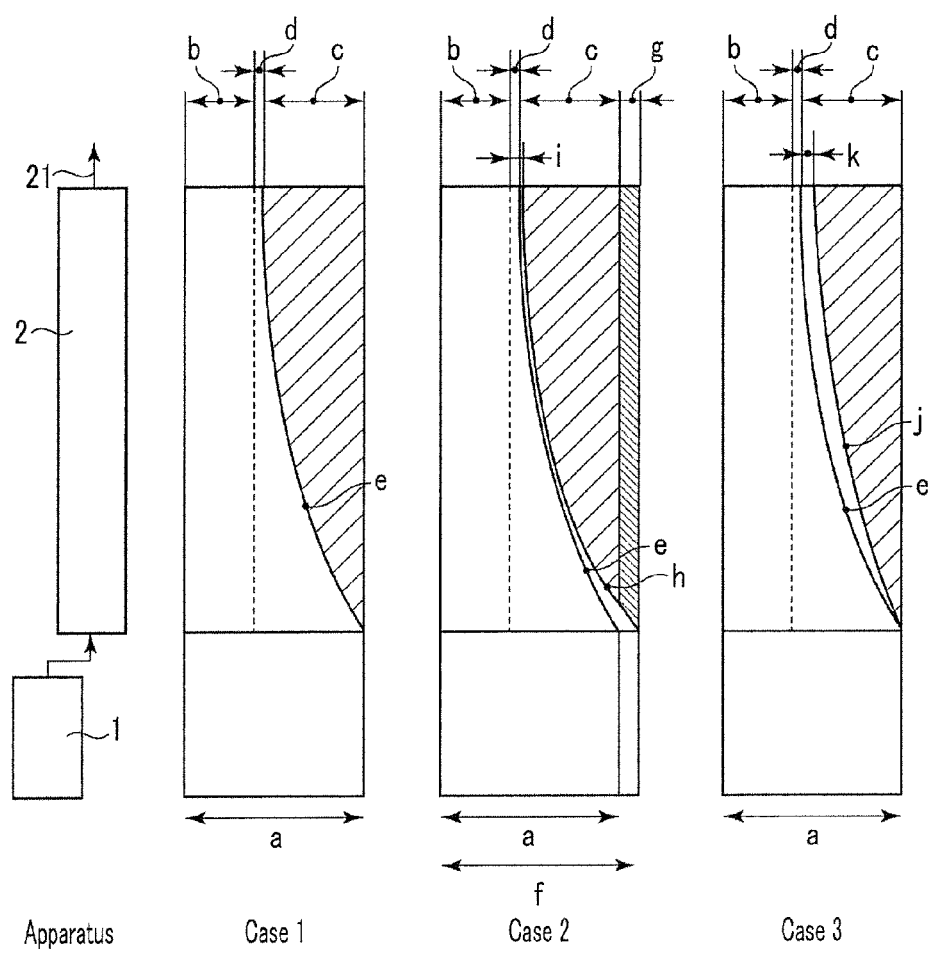
FIG. 9 illustrates a concentration image diagram of trichlorosilane.

A single epitaxial growth device is connected to the trichlorosilane gas supply apparatus 100 and allowed to run. A change in the concentration of the trichlorosilane-hydrogen mixed gas in the trichlorosilane gas supply apparatus 100 is described as three Cases 1 to 3 in FIG. 9. The trichlorosilane-hydrogen mixed gas produced in the evaporator 1 is cooled while passing through the condenser 2 and reaching the adjusted and mixed gas feeding pipe 21 such that trichlorosilane is condensed and liquefied and the concentration is adjusted.

Case 1 illustrates a basic change in the concentration of the mixed gas that occurs in the trichlorosilane gas supply apparatus 100. The trichlorosilane-hydrogen mixed gas that reaches a concentration a in the evaporator 1 is changed in concentration along a curve e in the condenser 2, and trichlorosilane corresponding to a concentration c is condensed until it reaches the adjusted and mixed gas feeding pipe 21. b represents the saturated concentration of the trichlorosilane-hydrogen mixed gas corresponding to the temperature of the condenser 2. However, the gas is not condensed by a concentration d and remains. This becomes a concentration that is inevitably increased due to a real apparatus in which the condenser 2 has a limited heat exchange area and a heat exchange time is limited.

Case 2 illustrates when rough temperature control is performed in the evaporator 1, or when the concentration of the trichlorosilane-hydrogen mixed gas produced in the evaporator 1 is changed by intentionally changing temperature. In Case 2, compared to Case 1, as the temperature is increased, the concentration f (=a+g) of the trichlorosilane-hydrogen mixed gas in the evaporator 1 is also increased, and the trichlorosilane-hydrogen mixed gas is changed in concentration along a curve h in the condenser 2. At a point where the adjusted and mixed gas feeding pipe 21 was reached, as the concentration of the trichlorosilane-hydrogen mixed gas in the evaporator 1 was increased by g, a concentration to which i is further added from b+d in Case 1 was achieved.

Case 3 illustrates when the use amount of the trichlorosilane-hydrogen mixed gas was increased compared to Case 1. A speed at which the trichlorosilane-hydrogen mixed gas passes through the condenser is higher than that in Case 1. Therefore, the concentration is changed along a curve j that is gentler than the curve e and the gas is not further condensed than Case 1 by a concentration k and remains. This explains an insufficient ability of the condenser.

A problem of using a single condenser for (a plurality of, for example) three epitaxial growth devices will be described below.

In this case, the concentration k in Case 3 causes a problem (it can be said that a concentration d+k corresponds to a concentration added due to the flow velocity of the gas). When the condenser is significantly large, there is a problem in cost and space. However, the concentration d+k is decreased and thus there is no problem in accuracy. There is concern that significant error may occur when two or three devices are allowed to run, it's not as if the concentration difference=(d+k)/b (caused by the flow velocity of the gas) is high enough to ignore d+k when the condenser has a size in a realistic range and the use amount of the mixed gas is slightly changed during running of the single epitaxial growth device.

On the other hand, the epitaxial growth devices are devices having the same type and, furthermore, the epitaxial growth devices in which three reaction containers are provided for a single device have substantially the same gas use amount. In this case, when a single condenser is prepared for each of the epitaxial growth devices, in the above expression, k=0, and d has the same value for each of the devices. As a result, the concentration difference becomes the same and repetitive reproducibility and variations between devices are eliminated.

Another example of the continuous distillation-type trichlorosilane vaporization supply apparatus according to the example, which is examined taking the foregoing circumstances into consideration, will be described in detail with reference to the drawings.

Figure 10:
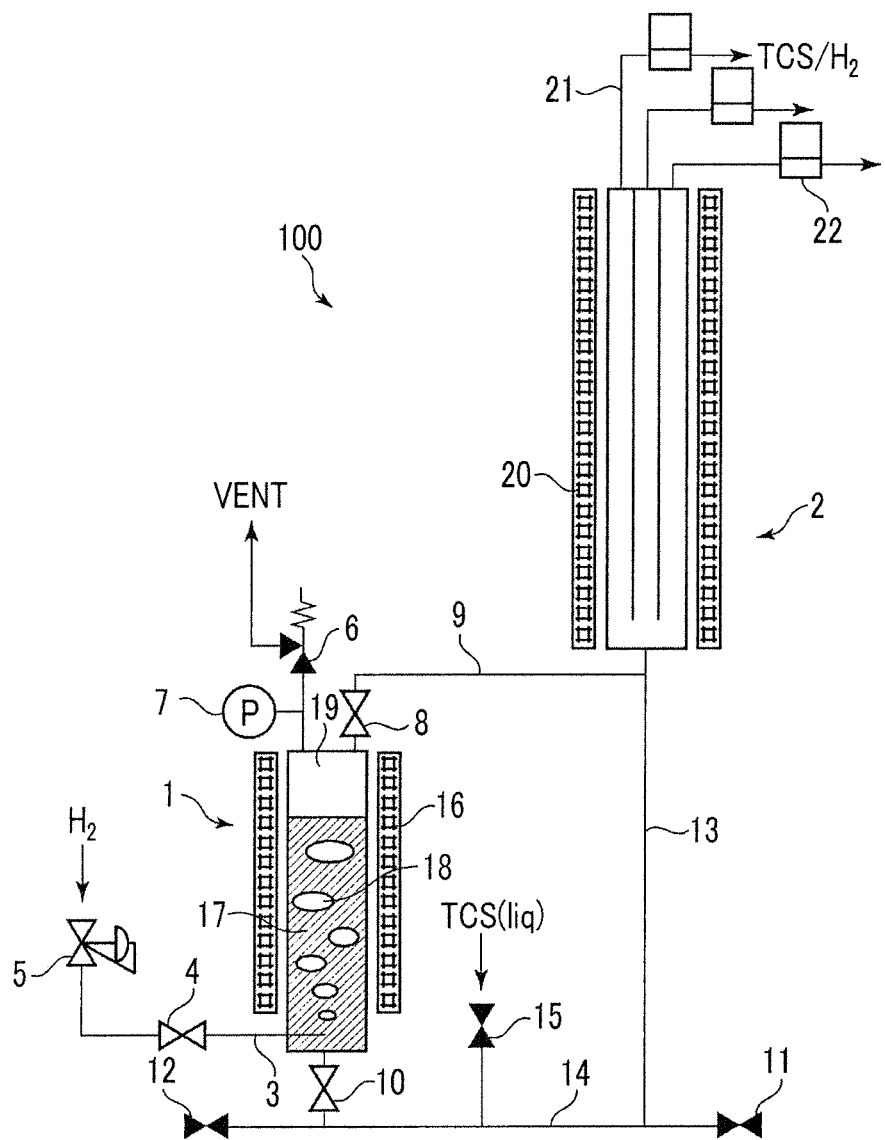
FIG. 10 illustrates a configuration diagram of another example of the trichlorosilane vaporization supply apparatus.

FIG. 10 is a view schematically illustrating a configuration of when the continuous distillation-type trichlorosilane vaporization supply apparatus supplies trichlorosilane to a plurality of devices.

The devices may act as reaction chambers provided in an epitaxial growth device. That is, in any when the epitaxial growth device has a single reaction chamber and when the epitaxial growth device has a plurality of reaction chambers, the continuous distillation-type trichlorosilane vaporization supply apparatus can supply trichlorosilane to the plurality of reaction chambers. Particularly, the continuous distillation-type trichlorosilane vaporization supply apparatus can stably supply trichlorosilane to two to three reaction chambers.

As illustrated in FIG. 10, the condenser 2 provided in the continuous distillation-type trichlorosilane vaporization supply apparatus 100 can supply trichlorosilane to the plurality of devices.

FIG. 10 is an example in which the inside of a single condenser is divided into three sections. When these are referred to as an a region, a b region, and a c region, the regions may be regarded as three condensers having substantially the same heat transfer area. According to this configuration, even when three condensers are necessary in the related art, a single condenser can cope with the necessity. Therefore, cost and space can be reduced.

Figure 11:
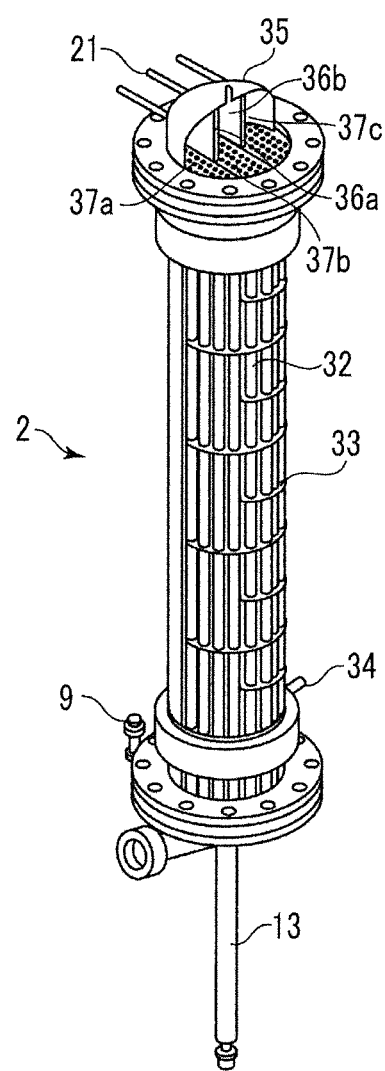
FIG. 11 illustrates another example of the condenser used in the apparatus.

In addition, as illustrated in FIG. 11, by providing a distribution portion 35 for distributing trichlorosilane that has passed through the condenser 2 to the plurality of devices at the upper end of the condenser 2, the above-described effect can be realized.

The condenser 2 may include a plurality of gas conduction pipes (tubes) 32, and the distribution portion 35 may include barriers 36a and 36b that partition the outlets of the plurality of gas conduction pipes into the number of the plurality of devices. For example, when the number of devices is three, the outlets of the plurality of gas conduction pipes 32 may be partitioned into three partitions 37a, 37b, and 37c by the two barriers 36a and 36b. In addition, the number of partitions may be appropriately changed depending on the number of devices.

The adjusted and mixed gas feeding pipe 21 that feeds trichlorosilane to the plurality of devices may be connected to each of the outlets of the plurality of gas conduction pipes 32 which are partitioned.

Figure 12A:
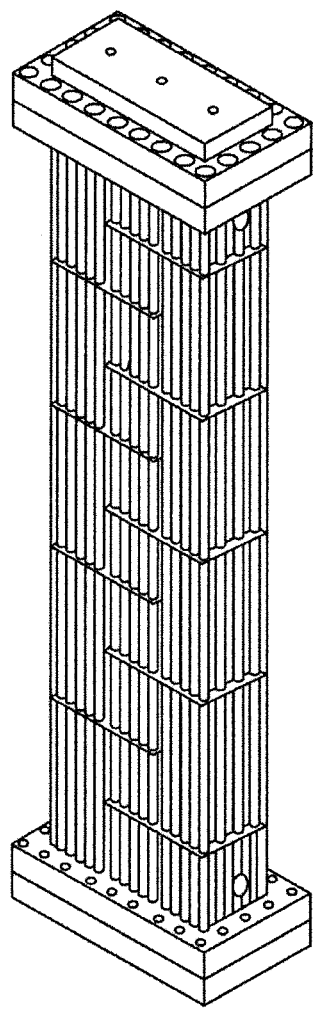
FIGS. 12A and 12B illustrate still another example of the condenser used in the apparatus.
Figure 12B:
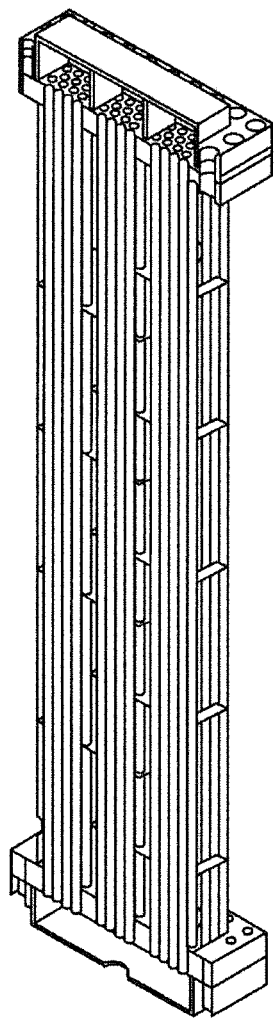

In addition, as an example of the shape of the condenser 2, as well as a columnar shape illustrated in FIG. 11, a quadrangular prism shape as illustrated in FIG. 12 may be employed. FIG. 12A schematically illustrates the external appearance of a condenser having a quadrangular prism shape, and FIG. 12B schematically illustrates the internal structure of the condenser having the quadrangular prism shape and illustrates an example in which the outlets of the plurality of gas conduction pipes are partitioned into three sections. A space in which the condenser having a quadrangular prism shape is disposed can be further reduced compared to the condenser having a columnar shape.

INDUSTRIAL APPLICABILITY

My apparatus and methods are limited to trichlorosilane. However, the same configuration as that of the apparatus can be applied to a vaporization supply apparatus for a material such as tetrachlorosilane ($SiCl_4$, boiling point 57.6° C.) and germanium tetrachloride ($GeCl_4$, boiling point 84° C.).

The invention claimed is:

1. A continuous distillation trichlorosilane vaporization supply apparatus comprising:
    an evaporator including an introduction port for hydrogen gas as a carrier gas and having a heater that vaporizes liquid trichlorosilane;
    a carrier hydrogen gas supply pipe connected to the evaporator; and
    a condenser that condenses liquid at a temperature corresponding to a saturated vapor pressure, which is lower than a vapor pressure of the vaporized trichlorosilane gas,
    wherein a center line of the evaporator and a center line of the condenser are not on the same line,
    a lower end of the condenser has a structure that directly communicates with a lower end of the evaporator through a pipe,
    an upper end of the condenser is provided with a gas feeding pipe,
    the liquid trichlorosilane passes through a trichlorosilane replenishing valve and replenishes the evaporator,
    the carrier hydrogen gas supply pipe and the trichlorosilane supply valve are different structures,
    the upper end of the condenser is provided with a distribution plate that distributes the trichlorosilane-hydrogen mixed gas that has passed through the condenser to a plurality of devices, and
    an inside of a single condenser is divided in plural sections.

2. The apparatus according to claim 1, further comprising:
    a temperature control mechanism of the condenser; and
    a pressure adjusting mechanism of the condenser.

3. The apparatus according to claim 1,
    wherein the condenser includes a plurality of gas conduction pipes, and
    the distribution plate includes barriers that partition outlets of the plurality of gas conduction pipes into the plurality of devices.

4. The apparatus according to claim 3, further comprising a plurality of adjusted and mixed gas feeding pipes that feed the trichlorosilane to the plurality of devices and connect to each of the outlets of the plurality of gas conduction pipes that are partitioned.

* * * * *